(12) United States Patent
Shiba

(10) Patent No.: US 6,662,142 B2
(45) Date of Patent: Dec. 9, 2003

(54) SYSTEM FOR PROVIDING INFORMATION ON QUALITY AND RELIABILITY OF OPTICAL SEMICONDUCTOR DEVICE BY USING COMMUNICATION NETWORK

(75) Inventor: Shigemitsu Shiba, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 73 days.

(21) Appl. No.: 09/994,734

(22) Filed: Nov. 28, 2001

(65) Prior Publication Data

US 2002/0081757 A1 Jun. 27, 2002

(30) Foreign Application Priority Data

Dec. 11, 2000 (JP) ........................................ 2000-376269

(51) Int. Cl.[7] .............................................. G01R 31/26
(52) U.S. Cl. ....................................... 702/182; 324/765
(58) Field of Search ............................. 702/81–84, 117, 702/120, 176–177, 179–185, 188; 324/509, 527, 537, 763–765; 716/4; 714/1, 25, 48; 700/95–97, 108–110, 121

(56) References Cited

U.S. PATENT DOCUMENTS

| | | | | |
|---|---|---|---|---|
| 4,805,089 A | * | 2/1989 | Lane et al. ................... | 700/83 |
| 5,452,218 A | * | 9/1995 | Tucker et al. ................ | 700/110 |
| 5,936,294 A | * | 8/1999 | Zhang ......................... | 257/435 |
| 6,017,143 A | * | 1/2000 | Eryurek et al. ................ | 700/51 |
| 6,140,045 A | * | 10/2000 | Wohlstadter et al. .......... | 435/6 |
| 6,256,593 B1 | * | 7/2001 | Damon et al. ................ | 702/84 |
| 6,327,407 B1 | * | 12/2001 | Mitsuda et al. ............... | 385/49 |

* cited by examiner

Primary Examiner—Marc S. Hoff
Assistant Examiner—Mary Catherine Baran
(74) Attorney, Agent, or Firm—Fitzpatrick, Cella, Harper & Scinto

(57) ABSTRACT

The system for providing information on quality and reliability according to the present invention includes: a first information communication terminal for outputting, as information on a side of a maker producing an optical semiconductor device, information gathered at a first time regarding a characteristic of the device; a second information communication terminal for outputting, as information on a side of a user using the device, information gathered at a second time regarding the characteristic of the device; and an information processing apparatus that (1) computes a rate of change in the characteristic of the device from the first time to the second time on the basis of the information outputted from the first and second information terminals, and (2) outputs a signal representing an abnormality to at least one of the first and second information terminals when the computed rate of change is out of a predetermined numerical range.

8 Claims, 3 Drawing Sheets

SYSTEM FOR PROVIDING INFORMATION ON QUALITY AND RELIABILITY OF OPTICAL SEMICONDUCTOR DEVICE BY USING COMMUNICATION NETWORK

BACKGROUND OF THE INVENTION

1. Field of the Invention

The present invention relates to a system for providing information on quality and reliability and, more particularly, to a system for providing information on the quality and reliability of an optical semiconductor device. The present invention achieves this by utilizing a communication network which controls and efficiently manages quality and reliability.

2. Related Background Art

In a conventional method for ensuring the quality and reliability of an optical semiconductor device, such as a semiconductor laser diode or a light emitting diode, a maker who produces the device uses data on the device obtained by inspection during production thereof and at the time of delivery to ensure the quality and reliability of the device, as shown in FIG. 1. On the other hand, a user who uses the device ensures the quality and reliability of an entire product incorporating the device by making an acceptance inspection of the device and a delivery inspection of the product incorporating the device. That is, the maker and the user respectively manage different data and methods to ensure the quality and reliability of their products.

On the contrary, devices, such as optical semiconductor devices, gradually degrade after production. Such devices degrade at different rates due to variations in production conditions. The rate of degradation of the devices will increase with the lapse of time if a production fault occurs or if the devices receive stress after production. In a case where the above-described conventional method is applied to such devices, it is not possible to compare the condition of the device when a product incorporating the device is delivered with the initial condition of the device. Also, the definition of an optical semiconductor device as a good product is so broad that there is a possibility that a product whose quality and reliability are uncertain may be recognized as a good product with reference to the delivery specifications.

SUMMARY OF THE INVENTION

An object of the present invention is to solve the above-described problems of the prior art with a system for providing quality and reliability information which is capable of accurately obtaining a condition of an optical semiconductor device at the time of delivering a product incorporating the device.

Another object of the present invention is to provide a system for providing information on quality and reliability, comprising: a first information communication terminal for outputting, as information on the side of a maker producing an optical semiconductor device, at least one of information on a characteristic of the device in a production step, information on the characteristic of the device before an aging step, information on the characteristic of the device after the aging step, and information on the characteristic of the device in a delivery inspection step of the device; a second information communication terminal for outputting, as information on the side of a user using the device, at least one of information on the characteristic of the device in an acceptance inspection step, information on the characteristic of the device in an inspection step when a product incorporating the device is assembled, and information on the characteristic of the device in an inspection step at the time of delivering the product; a communication network for transmitting the information outputted from the first and second information communication terminals; and an information processing apparatus connected to the first and second information communication terminals through the communication network, wherein the information processing apparatus computes a rate of change in the characteristic of the device from the steps on the maker side to the steps on the user side on the basis of information outputted from the first and second information terminals, and outputs a signal for representing an abnormality to at least one of the first and second information terminals through the communication network when the computed rate of change is out of a predetermined numerical range.

Still another object of the present invention is to provide a system for providing information on quality and reliability, comprising: a first information communication terminal provided on the side of a maker producing an optical semiconductor device; a second information communication terminal provided on the side of a user using the optical semiconductor device; a communication network; and an information processing apparatus connected to the first and second information communication terminals through the communication network, wherein the information processing apparatus comprises storage means for storing, as information on the side of the maker producing the device, maker-side information including at least one of information on a characteristic of the device in a production step, information on the characteristic of the device before an aging step, information on the characteristic of the device after the aging step, and information on the characteristic of the device in a delivery inspection step of the device, and for storing, as information on the side of the user using the device, user-side information including at least one of information on the characteristic of the device in an acceptance inspection step, information on the characteristic of the device in an inspection step when a product incorporating the device is assembled, and information on the characteristic of the device in an inspection step at the time of delivering the product; computation means for computing a rate of change in the characteristic of the device from the steps on the maker side to the steps on the user side on the basis of maker-side information and user-side information read out from the storage means, and for outputting a signal for representing an abnormality when the computed rate of change is out of a predetermined numerical range; and communication means for transmitting the signal for representing the abnormality outputted from the computation means to at least one of the first and second information communication terminals through the communication network.

DETAILED DESCRIPTION OF THE PREFERRED EMBODIMENT

An embodiment of the present invention will be described below in detail with reference to the accompanying drawings.

Ordinarily, a maker who produces optical semiconductor devices has a variety of production data and inspection data obtained at the time of production of the devices. The maker also has inspection data including data representing results of an initial energization test called "aging," which occurs after the completion of production and before delivery of the devices. On the other hand, a user who uses the optical semiconductor devices has data representing results of an inspection of the devices performed at the time of acceptance and data representing results of an inspection of products incorporating the devices on a unit or product basis.

The system according to the present invention is intended to enable these sorts of data to be shared on-line by using personal computers or the like. Specifically, the present invention comprises a system in which data on the initial characteristics of devices obtained by the maker and data on the characteristics of the devices obtained by a final inspection, e.g., an inspection performed by the user when a product is delivered, are compared with each other to determine whether a certain amount of degradation is acceptable. At this time, a decision is made as to whether the products should be delivered on the basis of the determination result. If it is determined that the product should not be delivered, a warning is displayed in real time on a personal computer or the like, or delivery is automatically stopped according to the decision.

At this point, items of data obtained as described above represent device characteristics or unit characteristics, and these items do not always coincide with each other. However, one characteristic item representing degradation of the optical semiconductor devices is noted, and the ratios of their numeral values are compared with each other. With this comparison, the optical semiconductor devices having a degradation rate departing from the average degradation rate (rate of change) can be identified, and screening of the devices can be preformed before delivery of the products from the user.

Figure 1:
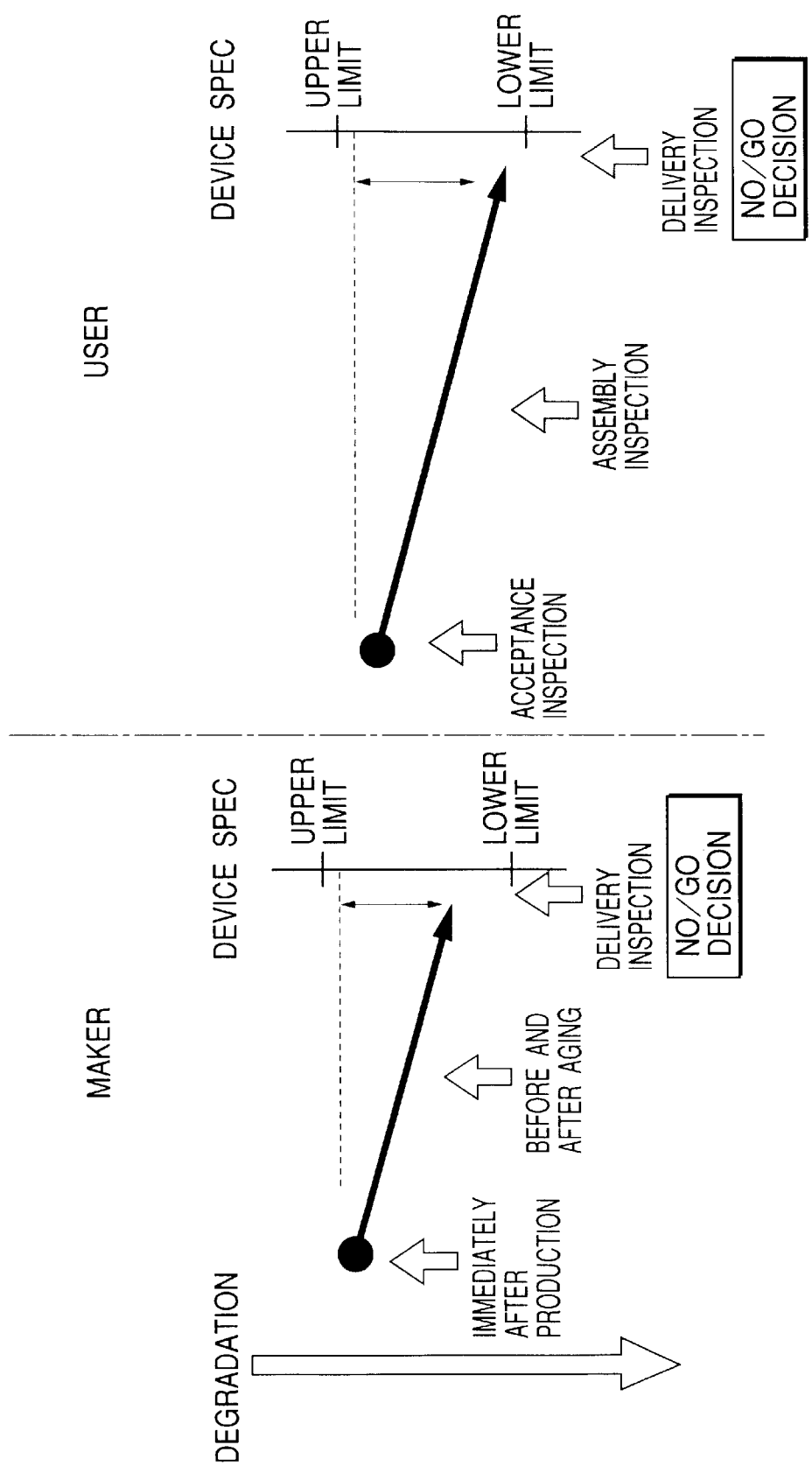
FIG. 1 is a diagram schematically showing a conventional method for quality control of an optical semiconductor device.
Figure 2:
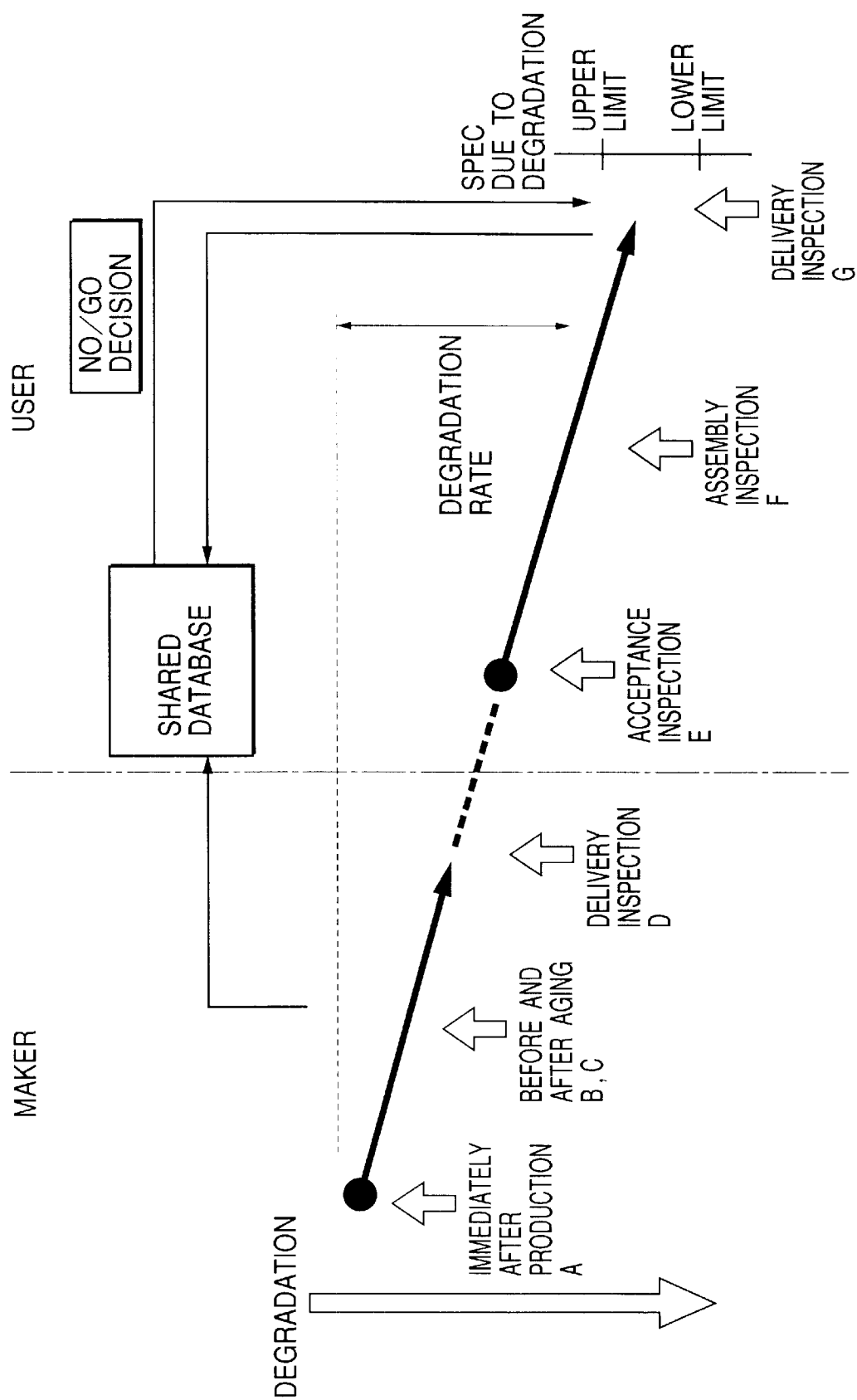
FIG. 2 is a diagram schematically showing a method for quality control using the system of the present invention.

FIG. 2 is a diagram schematically showing a quality control method using the system of the present invention. In FIG. 2, "A" represents the value of operating current in an optical semiconductor device, such as a semiconductor laser diode or a light emitting diode, for a predetermined optical output at the time of producing the device. This value is obtained by the maker producing the device. "B" and "C" respectively represent the values of operating currents for the predetermined optical output, measured under the same conditions as "A," but is measured before and after aging is carried out by the maker. "D" represents the value of operating current obtained by a delivery inspection. Next, "E" represents the value of operating current measured in the same manner, but in an acceptance inspection performed by a user who uses the devices. "F" and "G" respectively represent the values of operating currents in the optical semiconductor devices obtained when a unit incorporating the device is assembled and when a product incorporating the device is assembled. It is noted, however, that inspection data alternative to these operating current values may be obtained.

On the other hand, the value of the operating current in the optical semiconductor devices, e.g., semiconductor laser diodes or light emitting diodes, immediately after production is defined as an initial value A1, and data obtained at each step in time series order are defined as B1, C1, D1, E1, F1, and G1 being changed values from the initial value A1, respectively. Each of these changed values is supposed to generally exhibit an almost constant rate of change from the initial value A1 between different devices or lots if no production fault is caused and if no stress due to overvoltage or overcurrent is received.

In this situation, control is performed such that the rate of change from the initial value A1 of each of the change values B1, C1, D1, E1, F1, and G1 of the optical semiconductor devices at the steps always falls within a certain range based on a supposed rate of change at each step. This control is performed by setting, in a shared database, a certain range on the basis of the supposed rate of change at each step, by storing the data, by computing the rate of change on the basis of the change value sent from each step through a communication network, and by making a determination as to whether the rate of change falls in the range.

At the time of delivering the product incorporating the optical semiconductor device, if the change rate (degradation rate) of an optical semiconductor device from the initial value A1, based on the change value B1, C1, D1, E1, F1 or G1 from the initial value, exceeds a certain value determined by the maker and the user, a measure, such as displaying a warning to urge the user to stop the delivery of a product incorporating the device, is taken to stop the delivery of the degraded optical semiconductor devices. Also, when the rate of change exceeds the predetermined range at one of the maker side steps or one of the user side steps, production may be stopped at the one step.

Particularly, on-line communication may be performed between the optical semiconductor device maker and the optical semiconductor device user to manage the above-described data with personal computers, thereby enabling real-time monitoring of the degraded state of the optical semiconductor devices. Further, certain upper and lower limits of the rate of change may be set to enable screening of the products (devices) that have suffered a failure after deliver to the market.

A concrete embodiment of the system of the present invention for providing quality reliability information will be described below.

Figure 3:
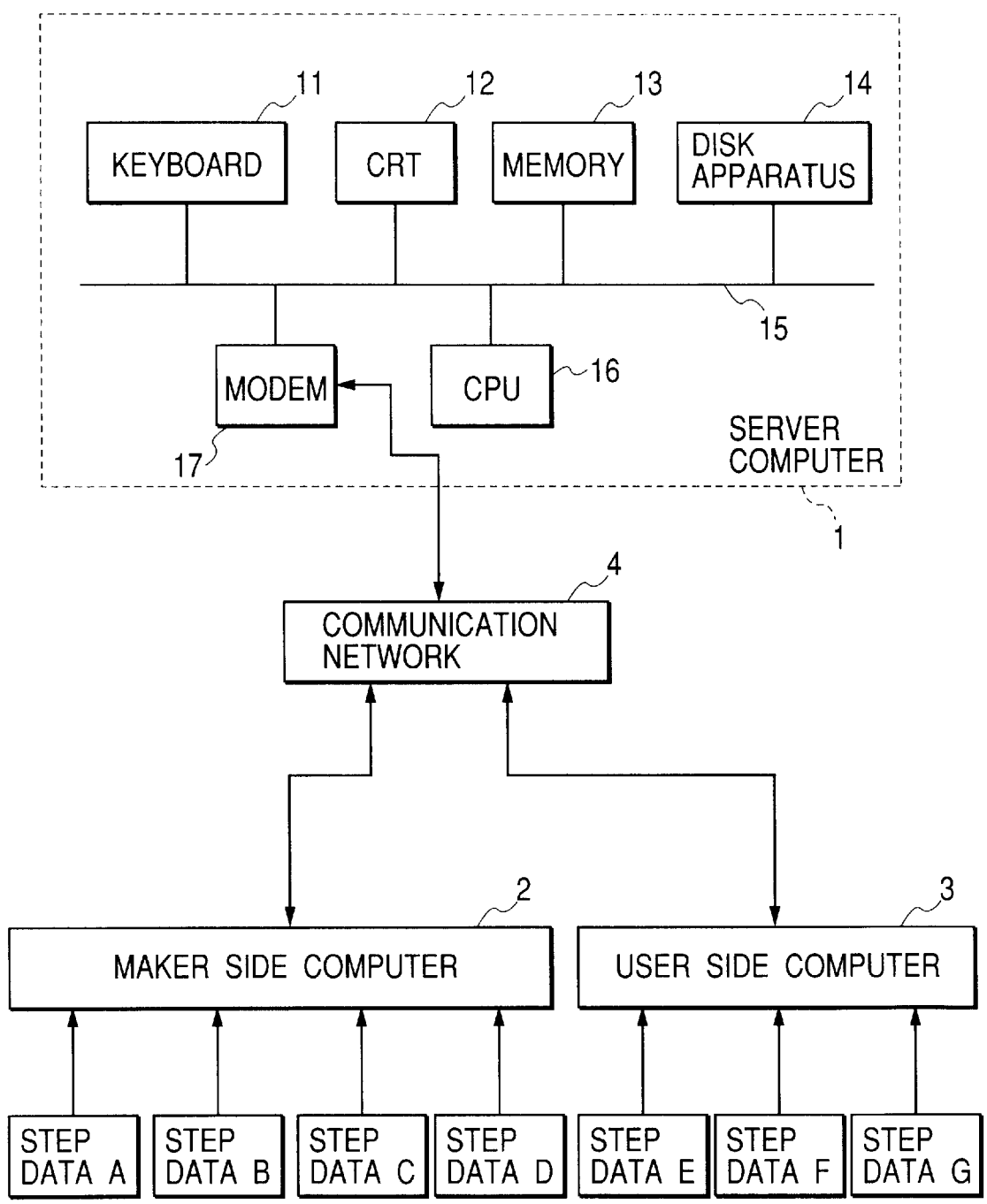
FIG. 3 is a block diagram showing an embodiment of the system for providing quality and reliability information according to the present invention.

FIG. 3 is a block diagram showing an embodiment of the system for providing quality and reliability information according to the present invention. Reference numeral 1 in FIG. 3 denotes a server computer which functions as an information processing apparatus. A modem 17, functioning as the communication means of the server computer 1, is supplied with step data A to D from a computer 2 on the maker side and step data E to G from a computer 3 on the user side through a communication network 4, such as a telephone circuit or satellite communication. The data A to D and E to G are stored in a disk apparatus 14 such as a hard disk constituting a database in the server computer 1 via a bus line 15 including an address bus and a data bus. The computer 2 on the maker side and the computer 3 on the user side form information communication terminals. Each of the computer 2 and the computer 3 may have the same configuration as the server computer 1.

In the disk apparatus 14, constituting a database, information about a permissible range based on a supposed rate of change at each of the steps on the maker side and each of the steps on the user side is stored in advance. To perform evaluation of the devices, the data groups A to D and E to G and the information about the permissible range are first read out from the disk apparatus 14 and are stored in a memory 13. A central processing unit (CPU) 16, which is a computation means, computes the rate of change in each of the above-described data A to G stored in the memory 13. The CPU 16 then compares each computed change rate with the permissible range stored in the memory 13. When the change rate is not within the permissible range, the CPU 16 transmits a warning signal from the modem 17 to the computer 3 on the user side through the communication network 4. At the time of receiving the warning signal, the computer 3 on the user side stops the delivery of the product incorporating the optical semiconductor device. When the change rate exceeds the predetermined range at one of the steps on the maker side or one of the steps on the user side, the production may be stopped at the one step. In FIG. 3, reference numeral 11 denotes a keyboard for inputting data, and reference numeral 12 denotes a cathode ray tube (CRT) for displaying warning information or the like.

In the above-described embodiment, the permissible range of the change rate at each of the steps on the maker side and each of the steps on the user side may be set and updated on the basis of step data A to G inputted during a certain time period.

In the system in the above-described embodiment, the server computer 1 may be in a sharing relationship with the computer 2 on the maker side or the computer 3 on the user side. That is, the computer on the maker side or the computer on the user side and the server computer may share a common database and send warning information from one to another. For example, when the server computer 1 and the maker-side computer 2 are in a sharing relationship, the server computer 1 may have the functions of the maker-side computer by inputting step data E to G via the keyboard 11 to store them in the disk apparatus 14. The server computer 1 may be provided in a place remote from the maker side or the user side, or may be provided on the maker side or the user side to be connected to the maker-side computer 2 or the user-side computer 3 by using a local area network (LAN).

The conditions of the optical semiconductor devices may be managed as a whole by using data on a production lot basis of the devices, instead of managing data with respect to single optical semiconductor devices as described in the above embodiment.

As described above, the present invention is applied to quality control of optical semiconductor devices having a spec width, defining the limits of what is a good product, in which it is difficult to determine whether each device is a good product or a defective product by measuring the condition of the device at one time only. The present invention can stop delivery of products incorporating defective devices, thereby preventing the failure of the products after delivering them on the market. Also, data is collected at each step before delivery of the products to allow the identification of a step in which a stress has been applied to the device.

What is claimed is:

1. A system for providing information on quality and reliability related to an optical semiconductor device, comprising:

a first information communication terminal for outputting, on a maker-side for producing the device, information on a characteristic of the device measured in a production step;

a second information communication terminal for outputting, as information on a user-side for using the device, information on the characteristic of the device measured in an inspection step at a time of delivering a product incorporating the device;

a communication network for transmitting the information outputted from the first and second information communication terminals; and an information processing apparatus connected to the first and second information communication terminals through the communication network, wherein the information processing apparatus computes a rate of change in the characteristic of the device from a time beginning with the measuring of the characteristic in the production step on the maker side on the basis of the information outputted from the first information communication terminal to a time ending with the measuring of the characteristic in the inspection step on the user side on the basis of the information outputted from the second information communication terminal, and wherein the information processing apparatus outputs a signal representing an abnormality to at least one of the first and second information communication terminals through the communication network when the computed rate of change is outside of a predetermined numerical range.

2. The system according to claim 1, wherein the optical semiconductor device comprises a light emitting device.

3. A system for providing information on quality and reliability related to an optical semiconductor device, comprising:

a first information communication terminal provided on a maker-side for producing the device;

a second information communication terminal provided on a user-side for using the device;

a communication network; and an information processing apparatus connected to the first and second information communication terminals through the communication network, wherein the information processing apparatus comprises:

storage means for storing, as information on the maker-side for producing the device, maker-side information including information on a characteristic of the device measured in a production step, and for storing, as information on the user-side for using the device, user-side information including information on the characteristic of the device measured in an inspection step at a time of delivering a product incorporating the device;

computation means for computing a rate of change in the characteristic of the device from a time beginning with the measuring of the characteristic in the production step on the maker side to a time ending with the measuring of the characteristic in the inspection step on the user side on the basis of the maker-side information and the user-side information, which are read out from the storage means, wherein the computation means is also for outputting a signal representing an abnormality when the computed rate of change is outside of a predetermined numerical range; and communication means for transmitting the signal for representing the abnormality outputted from the computation means to at least one of the first and second information communication terminals through the communication network.

4. A system according to claim 3, wherein the optical semiconductor device comprises a light emitting device.

5. A system for providing information on quality and reliability related to an optical semiconductor device, comprising:

a first information communication terminal for outputting, on a maker-side for producing the device, information on a characteristic of the device measured in a production step, information on the characteristic of the device measured before an aging step, information on the characteristic of the device measured after the aging step, and information on the characteristic of the device measured in an inspection step at a time of delivering the device;

a second information communication terminal for outputting, on a user-side for using the device, information on the characteristic of the device measured in an acceptance inspection step, information on the characteristic of the device measured in an inspection step when a product mounting the device is assembled, and information on the characteristic of the device measured in an inspection step at a time of delivering the product;

a communication network for transmitting the information outputted from the first and second information communication terminals; and an information processing apparatus connected to the first and second information communication terminals through the communication network, wherein the information processing apparatus computes a rate of change in the characteristic of the device from a time beginning with the measuring of the characteristic in the production step on the maker side to a time ending with the measuring of the characteristic in the inspection step at the time of delivering the product on the user side on the basis of the information outputted from the first and second information communication terminals, wherein the information processing apparatus outputs a signal representing an abnormality to at least one of the first and second information communication terminals through the communication network when the computed rate of change is outside of a predetermined numerical range.

6. A method of providing information on quality and reliability, comprising:

a step of receiving, from a maker producing an optical semiconductor device, information on a characteristic of the device measured in a production step;

a step of assembling a product mounting the device;

a step of receiving, from a user of the device, information on the characteristic of the device measured in an inspection step at a time of delivering the product;

a step of computing a rate of change in the characteristic of the device from a time beginning with the measuring of the characteristic in the production step to a time ending with the measuring of the characteristic in the inspection step on the basis of the information received from the maker and the user; and a step of sending a signal representing an abnormality when the computed rate of change is outside of a predetermined numerical range.

7. A method of providing information on quality and reliability, comprising:

a step of receiving, from a maker producing an optical semiconductor device, at least one of information on a characteristic of the device measured in a production step, information on the characteristic of the device measured before an aging step, information on the characteristic of the device measured after the aging step, and information on the characteristic of the device measured in an inspection step at a time of delivering the device;

a step of assembling a product mounting the delivered device;

a step of receiving information on the characteristic of the device measured in an inspection step at a time of delivering the product;

a step of computing a rate of change in the characteristic of the device from a time beginning with the measuring of the characteristic in the production step to a time ending with the measuring of the characteristic in the inspection step at the time of delivering the product, on the basis of the information received from the maker and the information received on the characteristic of the device measured in the inspection step at the time of delivering the product; and a step of sending a signal representing an abnormality when the computed rate of change is outside of a predetermined numerical range.

8. A method of providing information on quality and reliability, comprising:

a step of receiving, from a maker producing an optical semiconductor device, at least one of information on at least one characteristic of the device measured in a production step, information on said at least one characteristic of the device measured before an aging step, information on said at least one characteristic of the device measured after the aging step, and information on said at least one characteristic of the device measured in an inspection step at a time of delivering the device;

a step of receiving information on said at least one characteristic of the device measured in an acceptance inspection step;

a step of receiving information on said at least one characteristic of the device measured in an inspection step at a time of assembling a product mounting the device;

a step of receiving information on said at least one characteristic of the device measured in an inspection step at a time of delivering the product;

a step of computing a rate of change in each of said at least one characteristic of the device from a time beginning with the measuring of said at least one characteristic in the production step to a time ending with the measuring of said at least one characteristic in the inspection step at the time of delivering the product, on the basis of the information received from the maker and the information received on (1) said at least one characteristic of the device measured in the acceptance inspection step, (2) said at least one characteristic of the device measured in the inspection step at the time of assembling the product, and (3) said at least one characteristic of the device measured in the inspection step at the time of delivering the product; and a step of sending a signal representing an abnormality when the computed rate of change is outside of a predetermined numerical range.

* * * * *